(12) United States Patent
Liu et al.

(10) Patent No.: US 8,158,492 B2
(45) Date of Patent: Apr. 17, 2012

(54) MEMS MICROPHONE WITH CAVITY AND METHOD THEREFOR

(75) Inventors: Lianjun Liu, Chandler, AZ (US); Douglas G. Mitchell, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 314 days.

(21) Appl. No.: 12/432,377

(22) Filed: Apr. 29, 2009

(65) Prior Publication Data

US 2010/0276767 A1 Nov. 4, 2010

(51) Int. Cl.
*H01L 21/00* (2006.01)
(52) U.S. Cl. ............... 438/462; 438/48; 257/E21.599
(58) Field of Classification Search .............. 438/48, 438/462; 257/414, 704, 416, E21.523, E21.599; 381/175
See application file for complete search history.

(56) References Cited

U.S. PATENT DOCUMENTS

| | | | |
|---|---|---|---|
| 4,555,630 A | 11/1985 | Sheets et al. | |
| 6,521,513 B1* | 2/2003 | Lebens et al. ............ | 438/462 |
| 6,522,762 B1 | 2/2003 | Mullenborn et al. | |
| 6,675,472 B1 | 1/2004 | Huang et al. | |
| 6,781,231 B2 | 8/2004 | Minervini | |
| 6,788,795 B2 | 9/2004 | Scheeper et al. | |
| 7,166,910 B2 | 1/2007 | Minervini | |
| 7,202,552 B2 | 4/2007 | Zhe et al. | |
| 7,242,089 B2 | 7/2007 | Minervini | |
| 7,381,589 B2 | 6/2008 | Minervini | |
| 2003/0128854 A1 | 7/2003 | Mullenborn et al. | |
| 2004/0016995 A1 | 1/2004 | Kuo et al. | |
| 2004/0091125 A1 | 5/2004 | Choe et al. | |
| 2007/0009111 A1 | 1/2007 | Stenberg et al. | |
| 2007/0041597 A1 | 2/2007 | Song | |
| 2007/0165888 A1* | 7/2007 | Weigold ................. | 381/174 |
| 2008/0075309 A1* | 3/2008 | Chen et al. ............. | 381/175 |
| 2008/0175417 A1 | 7/2008 | Kok et al. | |
| 2008/0185699 A1* | 8/2008 | Wang ...................... | 257/676 |
| 2009/0169035 A1* | 7/2009 | Rombach et al. ....... | 381/175 |

OTHER PUBLICATIONS

Non-final Office Action dated Jan. 21, 2011 in U.S. Appl. No. 12/432,289.
U.S. Appl. No. 12/432,289, filed Apr. 29, 2009, Office Action—Rejection, mailed Sep. 1, 2011.

\* cited by examiner

*Primary Examiner* — Matthew Landau
*Assistant Examiner* — Daniel Luke
(74) *Attorney, Agent, or Firm* — James L. Clingan, Jr.; Daniel D. Hill

(57) ABSTRACT

A device comprises a substrate, a micro electro-mechanical systems (MEMS) structure, and a dielectric film. The substrate has a first side and a second side, the second side opposite the first side. The MEMS structure is formed on the first side of the substrate. The cavity is formed in the substrate directly opposite the MEMS structure. The cavity has an opening formed on the second side. The dielectric film is attached to the second side of the substrate and completely covering the opening. In one embodiment, the MEMS structure is a diaphragm for a microphone. Another embodiment includes a method for forming the device.

11 Claims, 3 Drawing Sheets

MEMS MICROPHONE WITH CAVITY AND METHOD THEREFOR

CROSS-REFERENCE TO RELATED APPLICATION(S)

This application is related to U.S. patent application Ser. No. 12/432,289, filed on even date herewith, titled "Shielding for a Micro Electro-Mechanical Device and Method Therefor," naming Jinbang Tang and Lianjun Liu as inventors, and assigned to the current assignee hereof.

BACKGROUND

1. Field

This disclosure relates generally to microphones, and more specifically, to MEMS microphones.

2. Related Art

The use of microelectromechanical systems (MEMS) microphones has increased with the use of cellular telephones and the use of computers for voice transmission. MEMS microphones are much smaller so have been popular for those uses. With increased usage, tolerance for low performance has diminished. One difficulty with MEMS microphones has been high frequency response. If voice is the only usage, high frequency may not be required but the increased usage has increased the demand for a better response even at frequencies above those normally used for voice communication. The common requirement for high fidelity sound transmission is 20 to 20,000 hertz. One technique that has been used in MEMS microphones has been to provide a shielded package box around the MEMS devices with a small opening as the sound input. It has been difficult to achieve an opening and box that does not result in resonance frequencies within the operating range.

Accordingly, there is a need for a MEMS microphone that improves upon one or more of the issues discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A microelectromechanical systems (MEMS) microphone is made by forming a MEMS structures on one side of a semiconductor wafer while forming a cavity in the semiconductor substrate behind each MEMS structure. The cavities are capped by a film rolled over the backside of the semiconductor substrate that is a dielectric dry film. The application of such a film by rolling it onto the backside of a semiconductor wafer has been found to be feasible. The dielectric dry film also adheres well to many surfaces including silicon. The dielectric, which may be photo-sensitive, is selectively removed to form scribe streets which expose the substrate. A metal layer may then be deposited over the backside which contacts the semiconductor substrate in the scribe street and may be used for an RF shield. After scribing, each structure may be placed face down onto a package substrate and with another integrated circuit to form a complete microphone including circuitry for providing a processed signal representative of the sound received.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
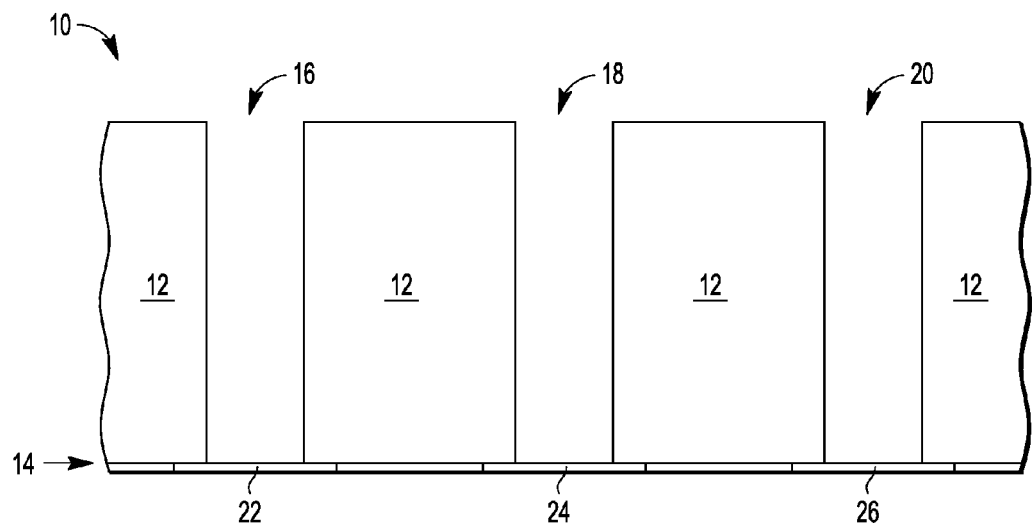
FIG. 1 is a cross section of a device structure at a stage in processing according to an embodiment.

Shown in FIG. 1 is a device structure 10 comprising a portion of a wafer having a substrate 12 and MEMS region 14 on a front side of the wafer. Substrate 12 may be silicon having cavities 16, 18, and 20 in which each cavity 16, 18, and 20 has an opening on the backside of the wafer. MEMS region 14 comprises a MEMS structure 22, a MEMS structure 24, and a MEMS structure 26 aligned to cavities 16, 18, and 20, respectively. Cavities 16, 18, and 20 may be about 200 to 1000 microns wide and about 700 microns deep. MEMS structures extend about 30 microns past the edge of the cavity to which they are aligned. This extended region is primarily for support. The depth may be established by the wafer thickness. A common thickness for 8 inch wafers is 725 microns which is a convenient dimension for the depth of cavities 16, 18, and 20. Cavities 16, 18, and 20 formed by an silicon etch that is selective to oxide. Oxide is used as an etch stop layer that is removed by an oxide etch after the silicon etch. MEMS structures 22, 24, and 26 are for forming microphones so have diaphragms formed of silicon so the oxide etch is selective to silicon and will not harm the diaphragms and other structures of silicon that are part of MEMS structures 22, 24, and 26. Sound will be received on the front side which is the side away from cavities 16, 18, and 20. Thus cavities 16, 18, and 20 need to be covered to block sound from the backside of MEMS structures 22, 24, and 26. The transfer from sound energy to electrical energy of a microphone is performed by the MEMS structure having movement that is responsive to sound and causes a change in capacitance which can be detected electrically. For proper operation the sound comes from only one side of the diaphragm to establish a pressure differential which is the reason the cavities need to be covered to block the sound from arriving at the backside.

Figure 2:
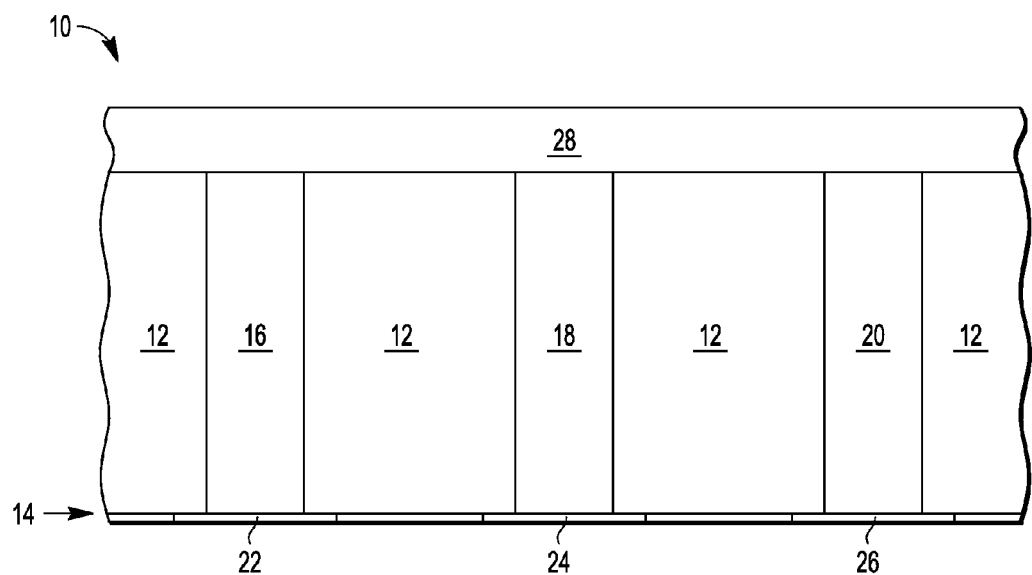
FIG. 2 is a cross section of the device structure of FIG. 1 at a subsequent stage in processing.

Shown in FIG. 2 is device structure 10 after rolling a dielectric dry film 28 over the backside of the wafer to cover cavities 16, 18, and 20. The dielectric dry film may come in rolls so can be conveniently rolled onto the backside of the wafer. An effective pressure for causing the dielectric dry film to adhere well to silicon is about 20 milliPascals to 60 milliPascals. Dielectric dry film 28 may be about 100 microns thick. Although pliable for purposes of rolling, dry dielectric film spanning 200 to 1000 microns is sufficiently rigid for microphone purposes. With dielectric dry film 28 completely covering the openings of cavities 16, 18, and 20 an effective seal against sound is formed for blocking sound from MEMS structures 22, 24, and 26.

Figure 3:
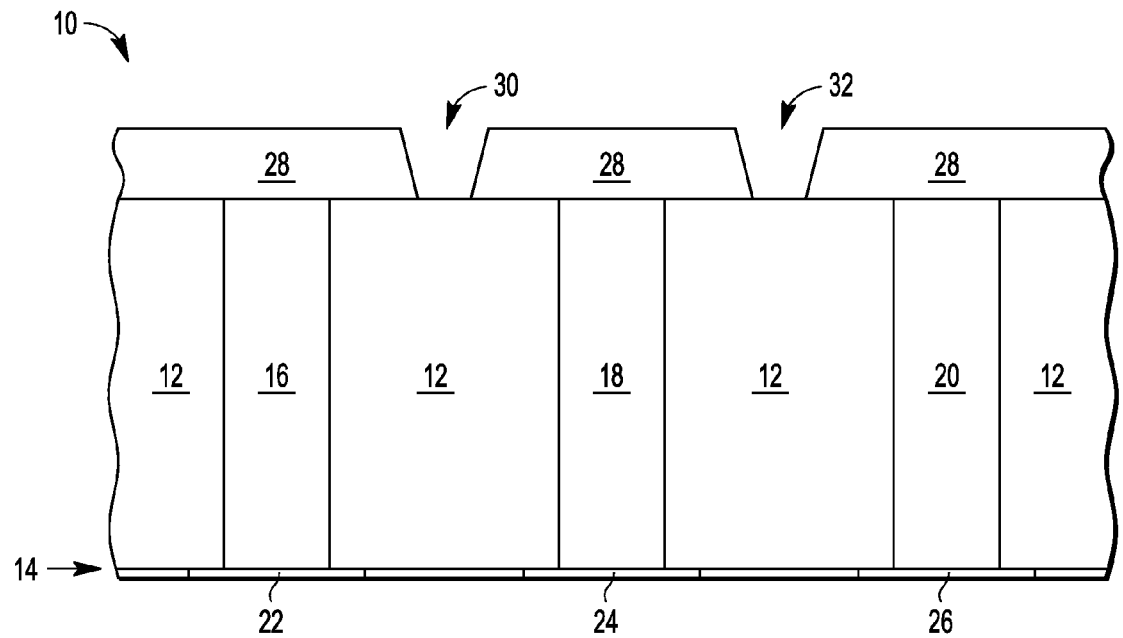
FIG. 3 is a cross section of the device structure of FIG. 2 at a subsequent stage in processing.

Shown in FIG. 3 is device structure 10 after etching through dielectric dry film 28 in street regions 30 and 32 between cavities 16, 18, and 20. The dry film can also be photosensitive and can be developed using conventional lithography and the developed portion can be easily removed in the manner of photoresist. The result is that substrate 12 is exposed in street regions 30 and 32. In this example, the width of exposure of substrate 12 is about 100 microns. The width of exposure is preferably greater than the amount of loss along a street during a scribe operation.

Figure 4:
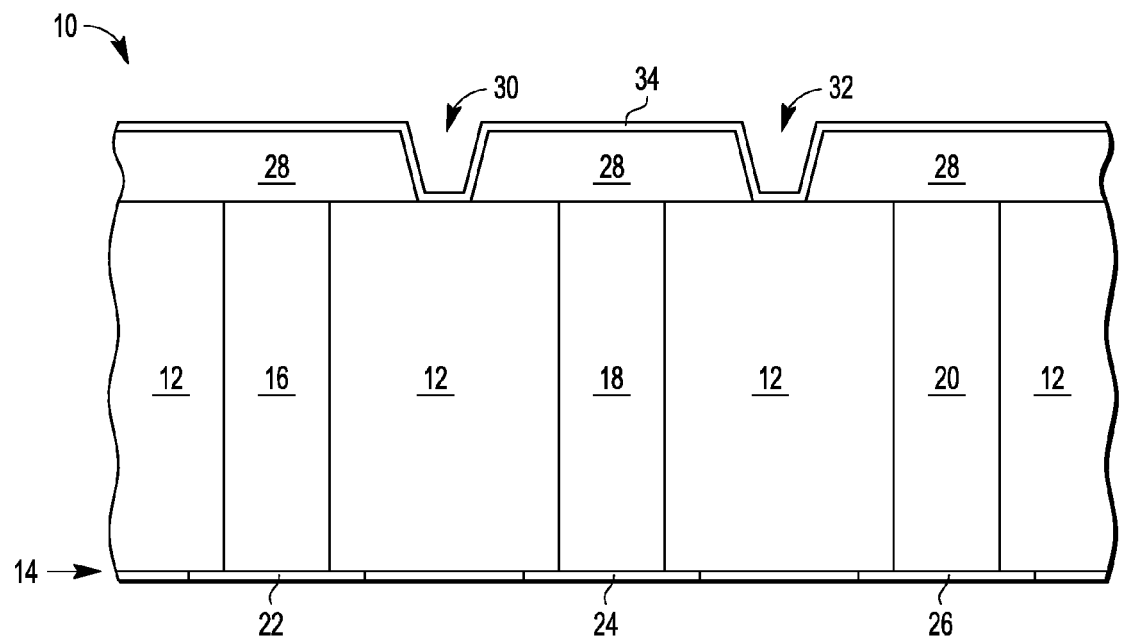
FIG. 4 is a cross section of the device structure of FIG. 3 at a subsequent stage in processing.

Shown in FIG. 4 is device structure 10 after depositing a metal layer 34, which may be aluminum, on dielectric dry film 28 and in street regions 30 and 32. Because substrate 12 is exposed in street regions 30 and 32, metal layer 34 is in contact with substrate 12 in street regions 30 and 32. Metal layer 34 may be deposited using conventional metal deposition techniques used in semiconductor manufacturing.

Figure 5:
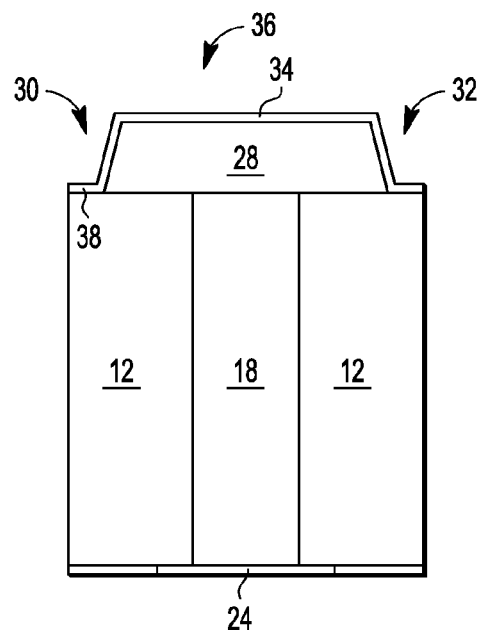
FIG. 5 is a cross section of the device structure of FIG. 4 at a subsequent stage in processing.

Shown in FIG. 5 is a MEMS microphone 36 after a scribe operation along street regions 30 and 32. This leaves MEMS structure 24 with cavity 18. Also shown is that the scribe operation leaves a contact 38 between metal layer 34 and substrate 12 at street 30. A similar contact remains between metal layer 34 and substrate 12 at street 32.

Figure 6:
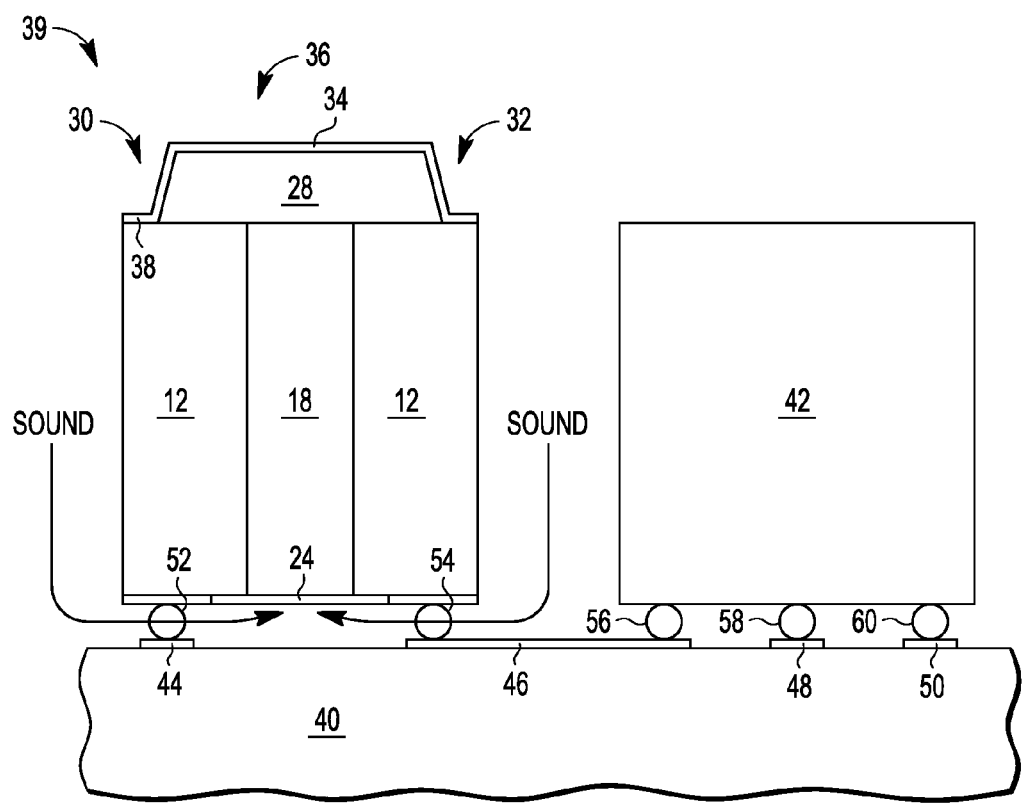
FIG. 6 is a portion of the device structure of FIG. 5 as part of a completed microphone system.

Shown in FIG. 6 is a microphone system 39 comprising MEMS microphone 36 with solder balls 52 and 54, a package substrate 40, and an integrated circuit 42 with solder balls 56, 58, and 60. Package substrate has contacts 44, 46, 48, and 50 on its top surface. Solder ball 52 is coupled to contact 44. Solder ball 54 is coupled to contact 46. Solder ball 56 is coupled to contact 46. Solder ball 56 is coupled to contact 48. Solder ball 60 is coupled to contact 50. Integrated circuit 42 functions to process capacitance change provided by MEMS microphone 36 in response to sound to electrical signals representative of the sound. Only two solder balls are shown attached to MEMS microphone 36 but others may be included. Sound is received between such solder balls.

As shown, dielectric dry film completely covers cavity 18 which is on the backside of MEMS structure 24. Sound is received by MEMS microphone 36 along side MEMS microphone 36 and then between package substrate 40 and the front side of MEMS structure 24. In the orientation shown, the front side of MEMS structure 24 and MEMS microphone 36 is the bottom of MEMS microphone 36. This provides the benefit of the front side being protected physically because the front side is facing substrate 40. The backside is covered so that a pressure differential can be established across the diaphragm. Metal layer 34 can be made to contact substrate 12 and to provide an RF and EMI shield for MEMS structure 24. Also, contact 38, for example, between metal layer 34 and substrate 12 is made especially convenient by dielectric dry film being photosensitive so that substrate 12 can be exposed in street regions 30 and 32 very easily.

By now it should be appreciated that there has been provided a device including a substrate having a first side and a second side, the second side opposite the first side. The device further includes a micro electro-mechanical systems (MEMS) structure formed on the first side of the substrate, and a cavity formed in the substrate directly opposite the MEMS structure, the cavity having an opening formed on the second side. The device further includes a dielectric film attached to the second side of the substrate and completely covering the opening. The device may be further characterized by the MEMS structure including a diaphragm for a microphone. The device may be further characterized by the substrate including silicon. The device may be further characterized by the substrate being a semiconductor wafer. The device may be further characterized by the dielectric film including a photosensitive dielectric film. The device may be further characterized by the photosensitive dielectric film including a scribe street formed therein. The device may further include a metal layer formed on the dielectric film. The device may be further characterized by the metal layer including aluminum.

Also described is a method including providing a substrate having a first side and a second side, the second side opposite the first side. The method further includes forming a micro electro-mechanical system (MEMS) structure on the first side of the substrate. The method further includes forming a cavity in the substrate directly opposite the MEMS structure, the cavity having an opening on the second side. The method further includes attaching a dielectric film to the substrate and completely covering the opening. The method may further comprise forming a scribe street in the dielectric film to expose a predetermined portion of the second side of the substrate; forming a metal layer over dielectric film and over the second side of the substrate in the scribe street; and forming a cut in the substrate in the scribe street. The method may further comprise forming a bond pad on the first side of the substrate. The method may be further characterized by forming a metal layer further comprising forming a metal layer in electrical contact with the substrate. The method may be further characterized by forming the MEMS structure further comprising forming a MEMS microphone diaphragm. The method may be further characterized by forming the MEMS structure in a polysilicon layer on the first side of the substrate. The method may be further characterized by attaching the dielectric film to the substrate further comprising attaching a photosensitive dielectric film having an adhesive on one side. The method may further comprise photo exposing the photosensitive dielectric film to a radiation to remove the dielectric film from over a predetermined scribe street of the substrate.

Described also is a method including providing a substrate having a first side and a second side, the second side opposite the first side. The method further includes forming a micro electro-mechanical system (MEMS) microphone diaphragm on the first side of the substrate. The method further includes forming a cavity in the substrate directly opposite the MEMS microphone diaphragm, the cavity having an opening on the second side. The method further includes attaching a photosensitive dielectric film to the substrate, the photosensitive dielectric film completely covering the opening. The method further includes exposing a predetermined portion of the photosensitive dielectric film to a radiation to remove a first portion of the photosensitive dielectric film from over the substrate in the predetermined portion and to leave a second portion of the photosensitive dielectric film over the opening. The method further includes forming a metal layer over the second portion of photosensitive dielectric film and contacting the substrate at the predetermined portion. The method may be further characterized by providing the substrate further comprising providing a silicon wafer. The method may further include forming a bond pad on the first side of the substrate. The method may be further characterized by forming the MEMS microphone diaphragm further comprising forming the MEMS microphone diaphragm in a polysilicon layer on the first side of the substrate.

Although the invention is described herein with reference to specific embodiments, various modifications and changes can be made without departing from the scope of the present invention as set forth in the claims below. For example, the substrate was described as being silicon but other materials may be effective. The MEMS system was shown as being formed of two devices, but it may be beneficial for the MEMS structure and the circuitry to be formed on the same substrate. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   providing a substrate having a first side and a second side, the second side opposite the first side;
   forming a micro electro-mechanical system (MEMS) structure on the first side of the substrate;
   forming a cavity in the substrate directly opposite the MEMS structure, the cavity having an opening on the second side;
   attaching a dielectric film to the substrate and completely covering the opening;
   etching through the dielectric film in a street region to expose a first portion of the substrate;
   forming a metal layer over the dielectric film and on the first portion of the substrate; and
   performing a scribe operation along the street region through the metal layer on the first portion of the substrate.

2. The method of claim 1, further comprising forming a bond pad on the first side of the substrate.

3. The method of claim 1, wherein forming a metal layer further comprises forming a metal layer in electrical contact with the substrate.

4. The method of claim 1, wherein forming the MEMS structure is further characterized as forming a MEMS microphone diaphragm.

5. The method of claim 1, wherein the forming the MEMS structure is further characterized as forming a polysilicon layer on the first side of the substrate.

6. The method of claim 2, wherein attaching the dielectric film to the substrate further comprises attaching a photosensitive dielectric film having an adhesive on one side.

7. The method of claim 6, further comprising photo exposing the photosensitive dielectric film to a radiation to remove the dielectric film from over a predetermined scribe street of the substrate.

8. A method comprising:
   providing a substrate having a first side and a second side, the second side opposite the first side;
   forming a micro electro-mechanical system (MEMS) microphone diaphragm on the first side of the substrate;
   forming a cavity in the substrate directly opposite the MEMS microphone diaphragm, the cavity having an opening on the second side;
   attaching a photosensitive dielectric film to the substrate, the photosensitive dielectric film completely covering the opening;
   exposing a predetermined portion of the photosensitive dielectric film to a radiation to remove a first portion of the photosensitive dielectric film from over the substrate in the predetermined portion and to leave a second portion of the photosensitive dielectric film over the opening; and
   forming a metal layer over the second portion of photosensitive dielectric film and contacting the substrate at the predetermined portion.

9. The method of claim 8, wherein providing the substrate further comprises providing a silicon wafer.

10. The method of claim 8, further comprising forming a bond pad on the first side of the substrate.

11. The method of claim 8, wherein forming the MEMS microphone diaphragm further comprises forming the MEMS microphone diaphragm in a polysilicon layer on the first side of the substrate.

* * * * *